US012750018B2

(12) United States Patent
Mao et al.

(10) Patent No.: US 12,750,018 B2
(45) Date of Patent: Sep. 29, 2026

(54) CLASS D AMPLIFIER AND RELATED CHIP AND ELECTRONIC APPARATUS

(71) Applicant: SHENZHEN GOODIX TECHNOLOGY CO., LTD., Shenzhen (CN)

(72) Inventors: Kai Mao, Shenzhen (CN); Long Huang, Shenzhen (CN); Junjun Zhang, Shenzhen (CN); Yuqing Yang, Shenzhen (CN)

(73) Assignee: SHENZHEN GOODIX TECHNOLOGY CO., LTD. (CN)

( * ) Notice: Subject to any disclaimer, the term of this patent is extended or adjusted under 35 U.S.C. 154(b) by 441 days.

(21) Appl. No.: 18/509,452

(22) Filed: Nov. 15, 2023

(65) Prior Publication Data

US 2024/0097627 A1 Mar. 21, 2024

Related U.S. Application Data

(63) Continuation of application No. PCT/CN2022/080558, filed on Mar. 14, 2022.

(51) Int. Cl.
*H03F 3/217* (2006.01)
*H03K 3/017* (2006.01)
(Continued)

(52) U.S. Cl.
CPC ............ *H03F 3/217* (2013.01); *H03K 3/017* (2013.01); *H03K 3/037* (2013.01); *H03K 5/22* (2013.01); *H03K 19/21* (2013.01)

(58) Field of Classification Search
CPC ........ H03F 3/217; H03K 3/017; H03K 3/037; H03K 5/22; H03K 19/21
(Continued)

(56) References Cited

U.S. PATENT DOCUMENTS 9,866,187 B2 * 1/2018 Liu ........................ H03F 3/183
2003/0001612 A1 1/2003 Menezes et al.
(Continued)

FOREIGN PATENT DOCUMENTS

CN 1957525 A 5/2007
CN 202068382 U * 12/2011
(Continued)

OTHER PUBLICATIONS

PCT International Search Report of PCT/CN2022/080558 issued on Nov. 22, 2022.

*Primary Examiner* — Hafizur Rahman
(74) *Attorney, Agent, or Firm* — Emerson, Thomson & Bennett, LLC; Roger D. Emerson; Peter R. Detorre

(57) ABSTRACT

A class D amplifier is provided, including: a first comparator, configured to generate a first comparison result based on a positive end input signal and a triangular wave; a second comparator, configured to generate a second comparison result based on a negative end input signal and the triangular wave; an exclusive OR gate, configured to generate a first control signal based on the first comparison result and the second comparison result; a first AND gate, configured to generate a positive end PMW output based on the first comparison result and the first control signal; and a second AND gate, configured to generate a negative end PMW output based on the second comparison result and the first control signal; and an output stage, configured to generate the positive end output signal and the negative end output signal correspondingly based on the positive end PMW output and the negative end PMW output.

20 Claims, 6 Drawing Sheets

(51) Int. Cl.
*H03K 3/037* (2006.01)
*H03K 5/22* (2006.01)
*H03K 19/21* (2006.01)

(58) Field of Classification Search
USPC .......................................................... 330/251
See application file for complete search history.

(56) References Cited

U.S. PATENT DOCUMENTS

| | | | | |
|---|---|---|---|---|
| 2003/0184391 | A1 | 10/2003 | Sekimoto | |
| 2004/0232979 | A1* | 11/2004 | Edwards | H03F 3/2173 330/10 |
| 2005/0270093 | A1* | 12/2005 | Kurokawa | H03F 3/2171 330/10 |
| 2020/0244265 | A1 | 7/2020 | Paganini et al. | |

FOREIGN PATENT DOCUMENTS

| | | | | | |
|---|---|---|---|---|---|
| CN | 204948031 | U | | 1/2016 | |
| CN | 106208991 | A | | 12/2016 | |
| CN | 110545082 | A | * | 12/2019 | H03F 3/217 |
| CN | 112491376 | A | | 3/2021 | |
| CN | 112865731 | A | * | 5/2021 | H03F 3/217 |
| EP | 3091659 | A1 | | 11/2016 | |
| JP | 2005210280 | A | | 8/2005 | |
| KR | 101665125 | B1 | | 10/2016 | |
| WO | WO-2005117250 | A1 | * | 12/2005 | H02P 7/29 |

* cited by examiner

CLASS D AMPLIFIER AND RELATED CHIP AND ELECTRONIC APPARATUS

CROSS REFERENCE TO RELATED APPLICATIONS

The present application is a continuation of international application No. PCT/CN2022/080558, filed on Mar. 14, 2022, which is hereby incorporated by reference in its entirety.

TECHNICAL FIELD

The present disclosure relates to a circuit, in particular to a Class D amplifier and a related chip and an electronic apparatus.

BACKGROUND

Conventional class-D amplifiers operate in a differential mode, and the output differential output signal is still operating in a switching state when a differential input signal is zero, resulting in power loss. In addition, The conventional class-D amplifiers have high-low level transitions on their positive end output signal and a negative end output signal at all times, and the resulting electromagnetic interference (EMI) is difficult to be controlled.

Therefore, how to solve the above problems has become one of the urgent problems in this art.

SUMMARY

One of the objectives of the present disclosure is to disclose a Class D amplifier and a related chip and an electronic apparatus to solve the above problems.

An embodiment of the present disclosure discloses a Class D amplifier, used to generate a differential output signal based on a differential input signal, where the differential input signal includes a positive end input signal, a negative end input signal, and the differential output signal includes a positive end output signal, a negative end output signal, and the class D amplifier includes: a PWM modulator, including: a first comparator, configured to generate a first comparison result based on the positive end input signal and a triangular wave; a second comparator, configured to generate a second comparison result based on the negative end input signal and the triangular wave; an exclusive OR gate, configured to generate a first control signal based on the first comparison result and the second comparison result; a first AND gate, configured to generate a positive end PMW output based on the first comparison result and the first control signal; and a second AND gate, configured to generate a negative end PMW output based on the second comparison result and the first control signal; and an output stage, configured to generate the positive end output signal and the negative end output signal correspondingly based on the positive end PMW output and the negative end PMW output.

An embodiment of the present disclosure discloses a chip, including the Class D amplifier described above.

An embodiment of the present disclosure discloses an electronic apparatus, including the chip described above.

The Class D amplifier and the related chip and the electronic apparatus in the present disclosure may reduce power consumption, while suppressing EMI.

DETAILED DESCRIPTION OF EMBODIMENTS

The following disclosure provides various embodiments or examples that can be used to realize different features of the present disclosure. The specific examples of components and configurations described below are intended to simplify the present disclosure. As will be appreciated, these descriptions are merely illustrative and are not intended to limit the present disclosure. For example, in the description below, forming a first feature on or over a second feature may include embodiments in which the first feature and the second feature are in direct contact with each other; and may also include embodiments in which additional components are formed between the first feature and the second feature such that the first feature and the second feature may not be in direct contact. In addition, the present disclosure may reuse component symbols and/or labels in multiple embodiments. Such reuse is for purposes of brevity and clarity and does not in itself represent a relationship between the different embodiments and/or configurations discussed.

While the numerical ranges and parameters used to define a broader scope of the present disclosure are approximate values, the relevant values in specific embodiments are presented herein as accurately as possible. However, it is inherent that any value will inevitably contain standard deviations due to individual test methods. In this context, "approximate" usually means that an actual value is within plus or minus 10%, 5%, 1%, or 0.5% of a particular value or range. Alternatively, the term "approximate" means that the actual value falls within an acceptable standard error of the mean, depending on the considerations of those having ordinary knowledge in the art to which the present disclosure belongs. It may be understood that, except for experimental examples, or unless otherwise expressly stated, all ranges, quantities, values and percentages used herein (e.g., to describe material amounts, time duration, temperature, operating conditions, quantity ratios, and the like) are modified by the term "approximate". Accordingly, unless otherwise indicated to the contrary, the numerical parameters disclosed in this specification and in the scope of accompanying patent applications are approximate and may be changed as necessary. At a minimum, these numerical parameters are to be understood as the effective number of digits indicated and values obtained by applying the general rounding method. Herein, the range of values is expressed as from one endpoint to the other or between two endpoints; unless otherwise indicated, the range of values described herein includes the endpoints.

Figure 1:
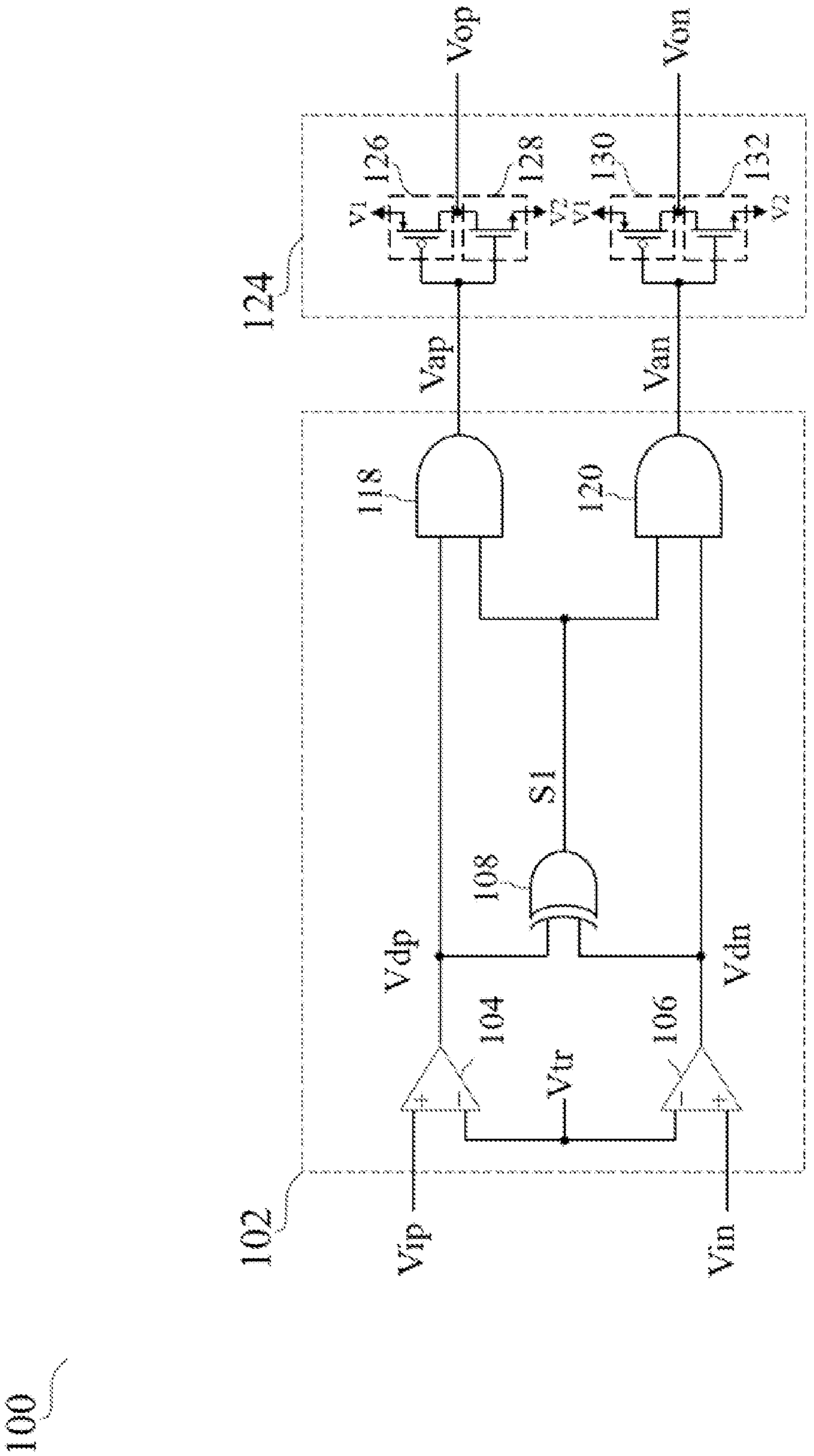
FIG. 1 is a schematic diagram of a first embodiment of a Class D amplifier of the present disclosure.

FIG. 1 is a schematic diagram of a first embodiment of a Class D amplifier of the present disclosure. The class D amplifier 100 is used to generate a differential output signal based on a differential input signal, where the differential input signal includes a positive end input signal Vip, and a negative end input signal Vin, and the differential output signal includes a positive end output signal Vop, and a negative end output signal Von. The positive end input signal Vip, and, the negative end input signal Vin may be generated by processing an audio source signal, for example, obtained by filtering and modulating the audio source signal. The Class D amplifier 100 contains a PWM modulator 102 and an output stage 124. The PWM modulator 102 modulates the differential input signal of a sine waveform type (e.g., sinusoidal curve or sinusoidal waveform) into a positive end PMW output, Vap, and a negative end PMW output, Van, of a high-frequency square waveform type, which are output by the output stage 124 as the differential output signal. The differential output signal is also a high-frequency square wave, therefore, an external low-pass filter (not shown in the drawings) is generally used to restore the differential output signal to a signal of the sine-waveform type, which is played out through a speaker (not shown in the drawings) after being filtered by the low-pass filter.

The objective of the present disclosure is to propose a new PWM modulation method, i.e., an improvement for the original PWM modulator. The use of the PWM modulator 102 of the present disclosure may make it possible that, when the differential input signal is zero, the positive end PMW output Vap and the negative end PMW output Van do not perform an action of high-low level transitions at all, and since the output stage 124 is only used to provide thrust to the positive end PMW output Vap and the negative end PMW output Van in order to be useful for driving the speaker after the output stage 124, behavior of the positive end output signal Vop and the negative end output signal Von may follow the behavior of the positive end PMW output Vap and the negative end PMW output Van. In other words, when the differential input signal is zero, the positive end output signal Vop and the negative end output signal Von also do not perform the action of high-low level transitions at all, thus reducing an overall static power consumption of the system in which the class D amplifier 100 is provided. In addition, the use of the PWM modulator 102 of the present disclosure also allows the positive end PMW output Vap and the positive end output signal Vop to perform the high-low level transitions action only when the positive end input signal Vip is greater than the negative end input signal Vin, and the negative end PMW output Van and the negative end output signal Von to perform the high-low level transitions action only when the negative end input signal Vin is greater than the positive end input signal Vip. In this way, an overall dynamic power consumption of the system in which the Class D amplifier 100 is provided may be reduced. Compared to the existing methods, the positive end output signal Vop and the negative end output signal Von of the present disclosure do not perform the high-low level transitions action for more than 50% of the time, in other words, the occurrence of high-frequency square wave has been reduced by 50%, therefore, an overall EMI may be reduced as well. In addition, the PWM modulation method does not generate more errors compared to the existing methods.

Figure 2:
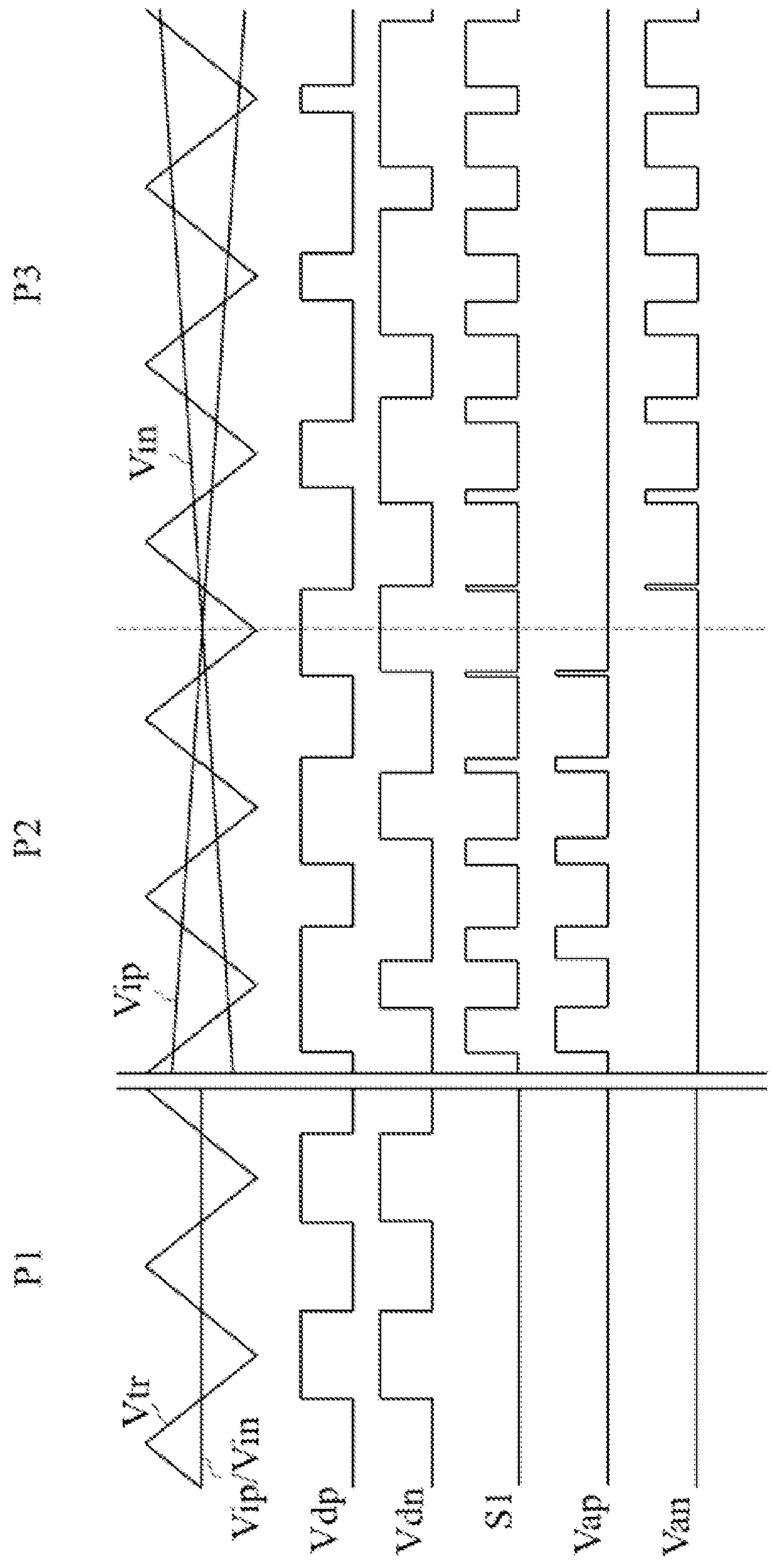
FIG. 2 is a timing diagram of some signals in the Class D amplifier of FIG. 1.

The PWM modulator 102 will be described in detail below, where timing variations of a plurality of signals are depicted in FIG. 2 for facilitating the reader's understanding. The PWM modulator 102 includes a first comparator 104, a second comparator 106, an exclusive OR gate 108, a first AND gate 118, and a second AND gate 120. Here, a positive input end (+) of the first comparator 104 receives the positive end input signal Vip, and a negative input end (−) of the first comparator 104 receives a triangular wave Vtr, and based on the positive end input signal Vip and the triangular wave Vtr, the first comparator 104 generates a first comparison result Vdp accordingly. Specifically, the triangular wave Vtr is a periodic triangular wave signal, when an amplitude of the positive end input signal Vip is greater than an amplitude of the triangular wave Vtr, the first comparison result Vdp is a high logic level; when the amplitude of the positive end input signal Vip is not greater than the amplitude of the triangular wave Vtr, the first comparison result Vdp is a low logic level. A positive input end (+) of the second comparator 106 receives the negative end input signal Vin, and a negative input end (−) of the second comparator 106 receives the triangular wave Vtr, and based on the negative end input signal Vin and the triangular wave Vtr, the second comparator 106 generates a second comparison result Vdn accordingly. Specifically, the triangular wave Vtr is a periodic triangular wave signal, when an amplitude of the negative end input signal Vin is greater than the amplitude of the triangular wave Vtr, the second comparison result Vdn is a high logic level; when the amplitude of the negative end input signal Vin is not greater than the amplitude of the triangular wave Vtr, the second comparison result Vdn is a low logic level.

The timing diagram of FIG. 2 contains three phases that the Class D amplifier 100 may occur during operation, i.e., a static phase P1, a positive input phase P2, and a negative input phase P3. During the static phase P1, the amplitude of the positive end input signal Vip and the amplitude of the negative end input signal Vin are zero (i.e., there is no differential input signal as described above). In this regard, the first comparison result Vdp and the second comparison result Vdn are both square waves with a duty cycle of 50%, and both the first comparison result Vdp and the second comparison result Vdn perform the high-low level transitions at the same point in time. During the positive input phase P2, since the amplitude of the positive end input signal Vip and the amplitude of the negative end input signal Vin are of the same magnitude but of opposite positive and negative magnitudes, the amplitude of the positive end input signal Vip is greater than zero and the amplitude of the negative end input signal Vin is less than zero during the positive input phase P2, i.e., the amplitude of the positive end input signal Vip is greater than the amplitude of the negative end input signal Vin, and in this case, each of the time points at which the first comparison result Vdp and the second comparison result Vdn perform high-low level transitions is different, as shown in FIG. 2. During the negative input phase P3, the amplitude of the negative end input signal Vin is greater than zero and the amplitude of the positive end input signal Vip is less than zero, i.e., the amplitude of the negative end input signal Vin is greater than the amplitude of the positive end input signal Vip, and in this case, the time points at which the first comparison result Vdp and the second comparison result Vdn perform high-low level transitions are also different, as shown in FIG. 2.

Generally, the first comparison result Vdp and the second comparison result Vdn are directly used as PWM modulation signals and output to the output stage. However, in the present disclosure, the PWM modulator 102 is additionally provided with an exclusive OR gate 108, a first AND gate 118, and a second AND gate 120. A first input end of the exclusive OR gate 108 receives the first comparison result Vdp, a second input end of the exclusive OR gate 108 receives the second comparison result Vdn, and the exclusive OR gate 108 performs an exclusive OR operation on the first comparison result Vdp and the second comparison result Vdn, and outputs a first control signal S1. As can be seen from FIG. 2, the first control signal S1 is a low logic level in the static phase P1, and square waves are only available in the positive input phase P2 and the negative input phase P3.

A first input end of the first AND gate 118 receives the first comparison result Vdp, a second input end of the first AND gate 118 receives the first control signal S1, and the first AND gate 118 performs an "AND" operation on the first comparison result Vdp and the first control signal S1 to generate the positive end PMW output Vap. A first input end of the second AND gate 120 receives the second comparison result Vdn, a second input end of the second AND gate 120 receives the first control signal S1, and the second AND gate 120 performs an "AND" operation on the second comparison result Vdn and the first control signal S1 to generate the negative end PMW output Van. As can be seen from the positive end PMW output Vap of FIG. 2, the first AND gate 118 retains a square wave of the first control signal S1 in the positive input phase P2 and filters a square wave of the first control signal S1 in the negative input phase P3; and as can be seen from the negative end PMW output Van of FIG. 2, the second AND gate 120 may retain the square wave of the first control signal S1 in the negative input phase P3 and filter the square wave of the first control signal S1 in the positive input phase P2.

The timing relationship in FIG. 2 is depicted based on an ideal state, in reality, a signal passes through each component in FIG. 1 with time consuming. Therefore, in some embodiments, a delay unit (not shown in the drawings) is added before the first input end of the first AND gate 118 and before the first input end of the second AND gate 120 to delay the first comparison result Vdp and the second comparison result Vdn to generate the delayed first comparison result and the delayed second comparison result respectively. The delay unit added before the first input end of the first AND gate 118 and before the first input end of the second AND gate 120 has the same amount of delay as elapsed time of the exclusive OR gate 108, and since the first input end of the first AND gate 118 receives the delayed first comparison result, the first input end of the second AND gate 120 receives the delayed second comparison result, and the exclusive OR gate 108 still receives the first comparison result Vdp, as well as the second comparison result Vdn, it is possible to make the positive end PMW output Vap and the negative end PMW output Van close to an ideal state as shown in FIG. 2.

In practice, it is inevitable that there are glitches in the positive end PMW output Vap and the negative end PMW output Van due to an undesired state. Therefore, in some embodiments, a low-pass filter (not shown in the drawings) may be provided between the output end of the first AND gate 118 and the output stage 124, and between the output end of the second AND gate 120 and the output stage 124, to eliminate the glitches in the positive end PMW output Vap and the negative end PMW output Van.

The output stage 124 is used to provide thrust to the positive end PMW output Vap and the negative end PMW output Van in order to be useful for driving the speaker after the output stage 124. A P-type MOSFET transistor 126 and an N-type MOSFET transistor 128 in the output stage 124 are connected in series between a reference voltage V1 and a reference voltage V2, and in this embodiment, the reference voltage V1 is higher than the reference voltage V2, where the reference voltage V2 is a ground voltage. A gate of the P-type MOSFET transistor 126 and a gate of the N-type MOSFET transistor 128 are co-coupled to the output end of the first AND gate 118 for outputting the positive end PMW output Vap to the positive end output signal Vop. A P-type MOSFET transistor 130 and an N-type MOSFET transistor 132 in the output stage 124 are connected in series between the reference voltage V1 and the reference voltage V2. A gate of the P-type MOSFET transistor 130 and a gate of the N-type MOSFET transistor 132 are co-coupled to the output end of the second AND gate 120 for outputting the negative end PMW output Van to the negative end output signal Von. It should be noted that the implementation with respect to the output stage 124 in embodiments of the present disclosure is merely illustrative, in practice, any different implementation of the output stage may be used with the PWM modulator 102 of the present disclosure.

In some embodiments, a gate driver (not depicted in the drawings) is also included between the PWM modulator 102 and the output stage 124 to enhance a drive ability of the positive end PMW output Vap and the negative end PMW output Van to drive the output stage 124.

Figure 3:
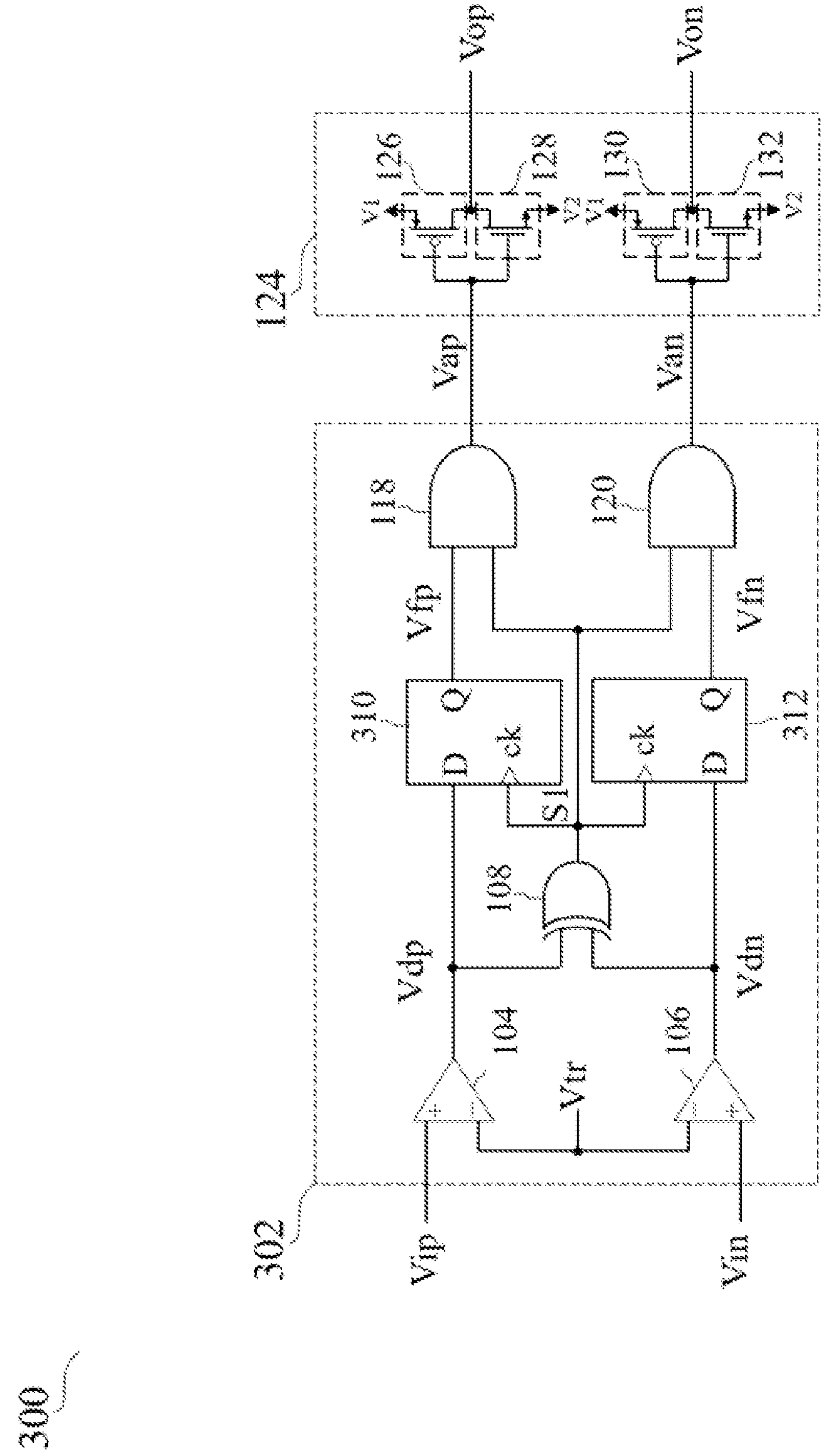
FIG. 3 is a schematic diagram of a second embodiment of a Class D amplifier of the present disclosure.

As mentioned above, in order to overcome the glitch problem of the class D amplifier 100, a low-pass filtering operation may be performed on the positive end PWM output Vap and the negative end PWM output Van. However, this inevita- bly results in a high-frequency portion of effective signals other than glitches being filtered along with the glitches. Therefore, the present disclosure proposes an alternative solution. FIG. 3 is a schematic diagram of a second embodiment of a Class D amplifier of the pre- sent disclosure. A Class D amplifier 300 differs from the Class D amplifier 100 in that the Class D amplifier 300 also contains a first flip-flop 310 and a second flip-flop 312. In this embodiment, the first flip-flop 310 as well as the second flip-flop 312 may be a D flip-flop, but the present disclosure is not limited hereby, any component that provides a similar function is within the scope of the present disclosure. A clock input end ck of the first flip- flop 310 receives the first control signal S1, and a data input end D of the first flip-flop 310 receives the first comparison result Vdp, so that a first trigger result Vfp outputted by an output end Q of the first flip-flop 310 may be synchronized in timing to the first control signal S1. A clock input end ck of the second flip-flop 312 receives the first control signal S1, and a data input end D of the second flip-flop 312 receives the second comparison re- sult Vdn, so that a second trigger result Vfn outputted by an output end Q of the second flip-flop 312 may be synchronized in timing to the first control signal S1. Accordingly, when the AND gate 118 performs an AND operation on the first trigger re- sult Vfp and the first control signal S1 which are synchronized with each other in timing, undesirable glitches may not be generated. Similarly, when the AND gate 120 performs an AND operation on the second trigger result Vfn and the first control signal S1 which are synchronized with each other in timing, undesirable glitches may not be generated.

Figure 4:
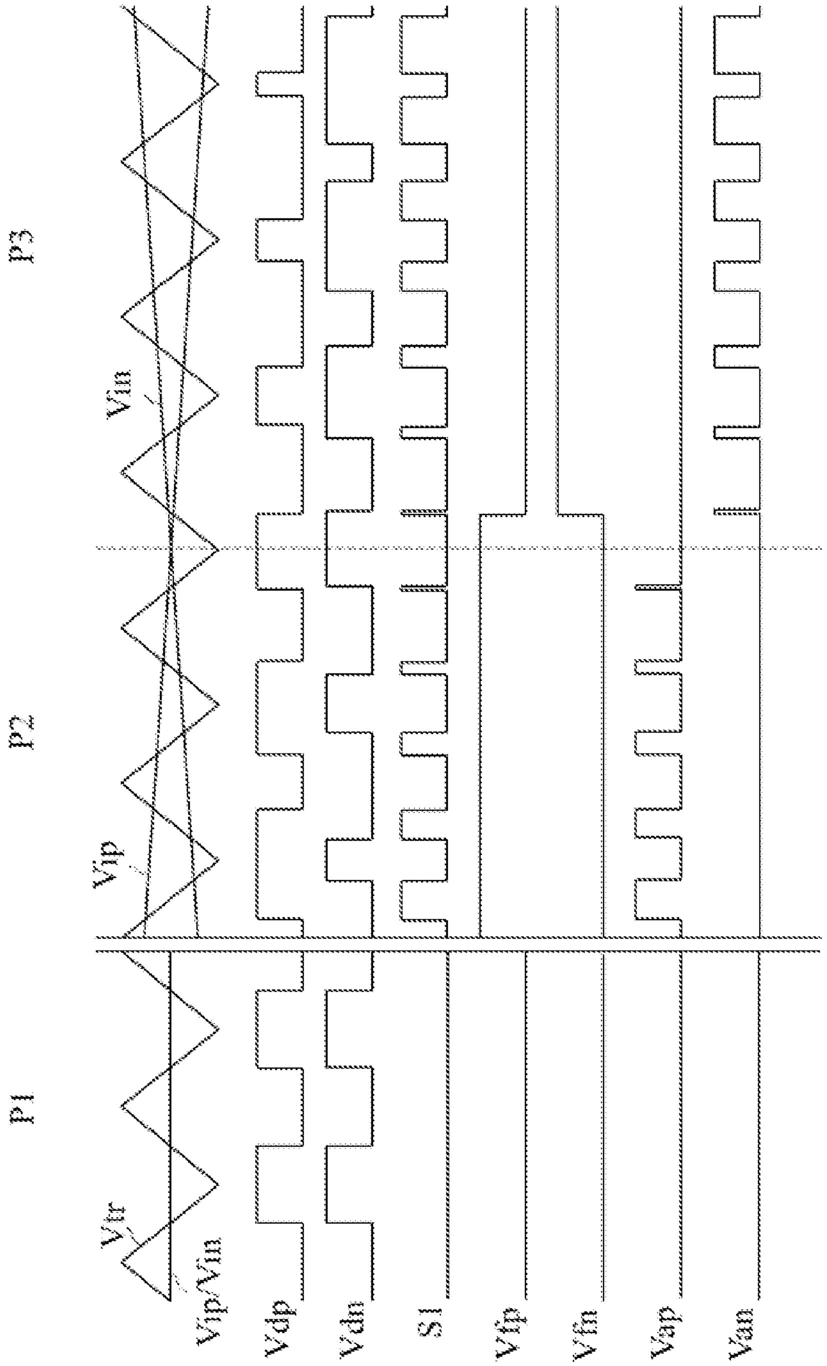
FIG. 4 is a timing diagram of some signals in the Class D amplifier of FIG. 3.

FIG. 4 is a timing diagram of some signals in the Class D amplifier 300. As can be seen from FIG. 4, using the first control signal S1 as a clock to trigger sampling of the first comparison result Vdp, the obtained first trigger result Vfp may be related to a relative magnitude relationship between the positive end input signal Vip and the negative end input signal Vin. In the positive input phase P2 in FIG. 4, a value of the first comparison result Vdp is a high logic level whenever a rising edge of the first control signal S1 is triggered, therefore, the first trigger result Vfp is maintained at a high logic level. Until a first rising edge trigger of the first control signal S1 starts after entering the negative input phase P3, the value of the first comparison result Vdp becomes a low logic level, so that the first trigger result Vfp is maintained at a low logic level, until entering the next positive input phase P2. Similarly, the second trigger result Vfn which is completely inverse to the first trigger result Vfp may be obtained.

Therefore, the first trigger result Vfp may be used instead of the first comparison result Vdp to enter the first input end of the AND gate 118, and the second trigger result Vfn may be used instead of the second comparison result Vdn to enter the first input end of the AND gate 120, in order to avoid the occurrence of glitches.

The timing relationship in FIG. 4 is depicted based on an ideal state, in reality, a signal passes through each component in FIG. 3 with time consuming. Therefore, in some embodiments, a delay unit (not depicted in the drawings) is additionally provided to delay the first control signal S1 to generate the delayed first control signal. The delayed first control signal enters the second input end of the first AND gate 118 and the second input end of the second AND gate 120. Compared to the first control signal S1, the delayed first control signal is delayed by the same length of time as elapsed time for a signal to travel from the clock input ends ck to the output ends Q of the first flip-flop 310 and the second flip-flop 312, so that the first trigger result Vfp and the second trigger result Vfn are close to an ideal state as shown in FIG. 4.

Compared to the Class D amplifier 100, the Class D amplifier 300 does not have glitches and does not require the additional use of a low-pass filter to filter glitches prior to the output stage 124, thus its signal distortion is low.

Figure 5:
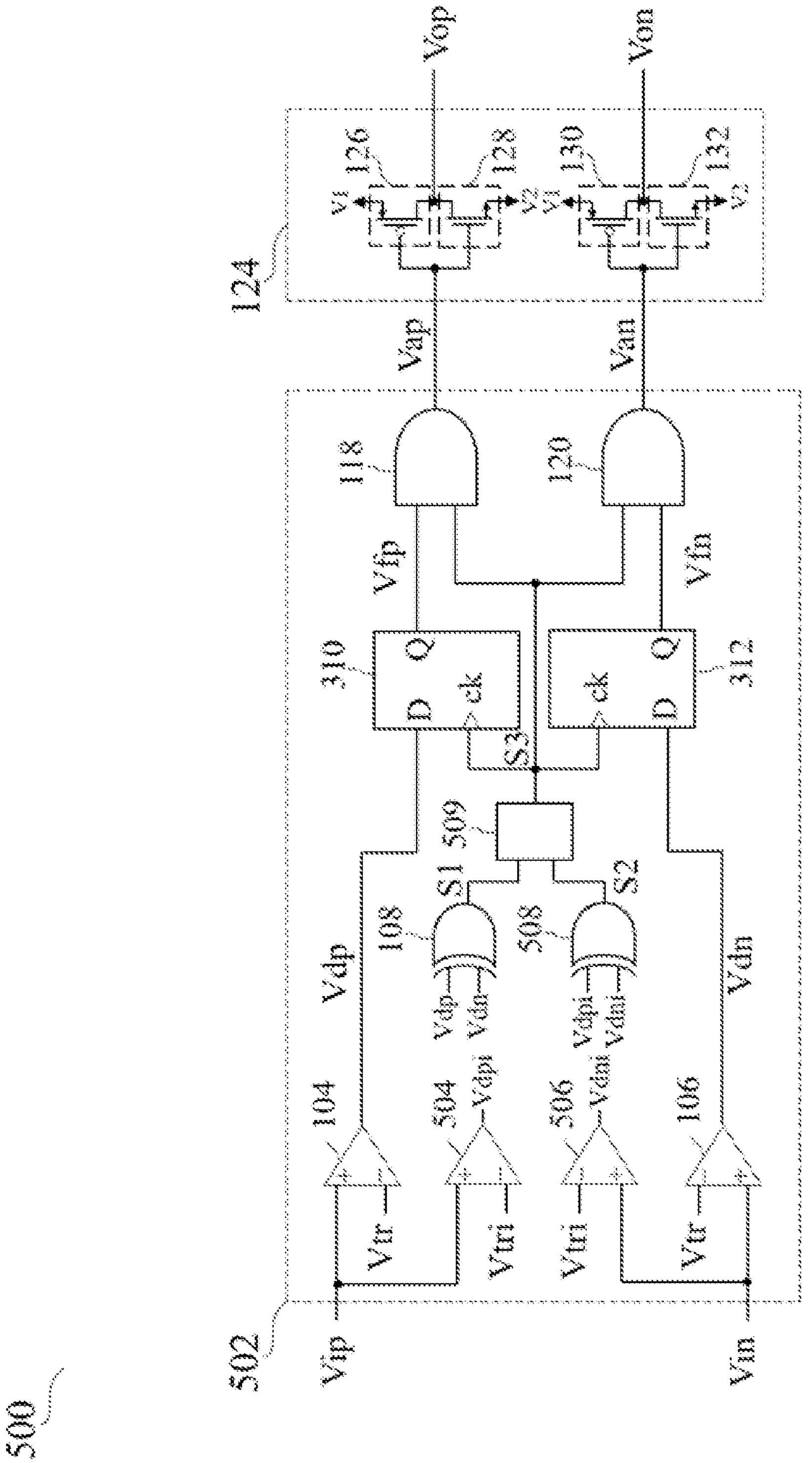
FIG. 5 is a schematic diagram of a third embodiment of a Class D amplifier of the present disclosure.
Figure 6:
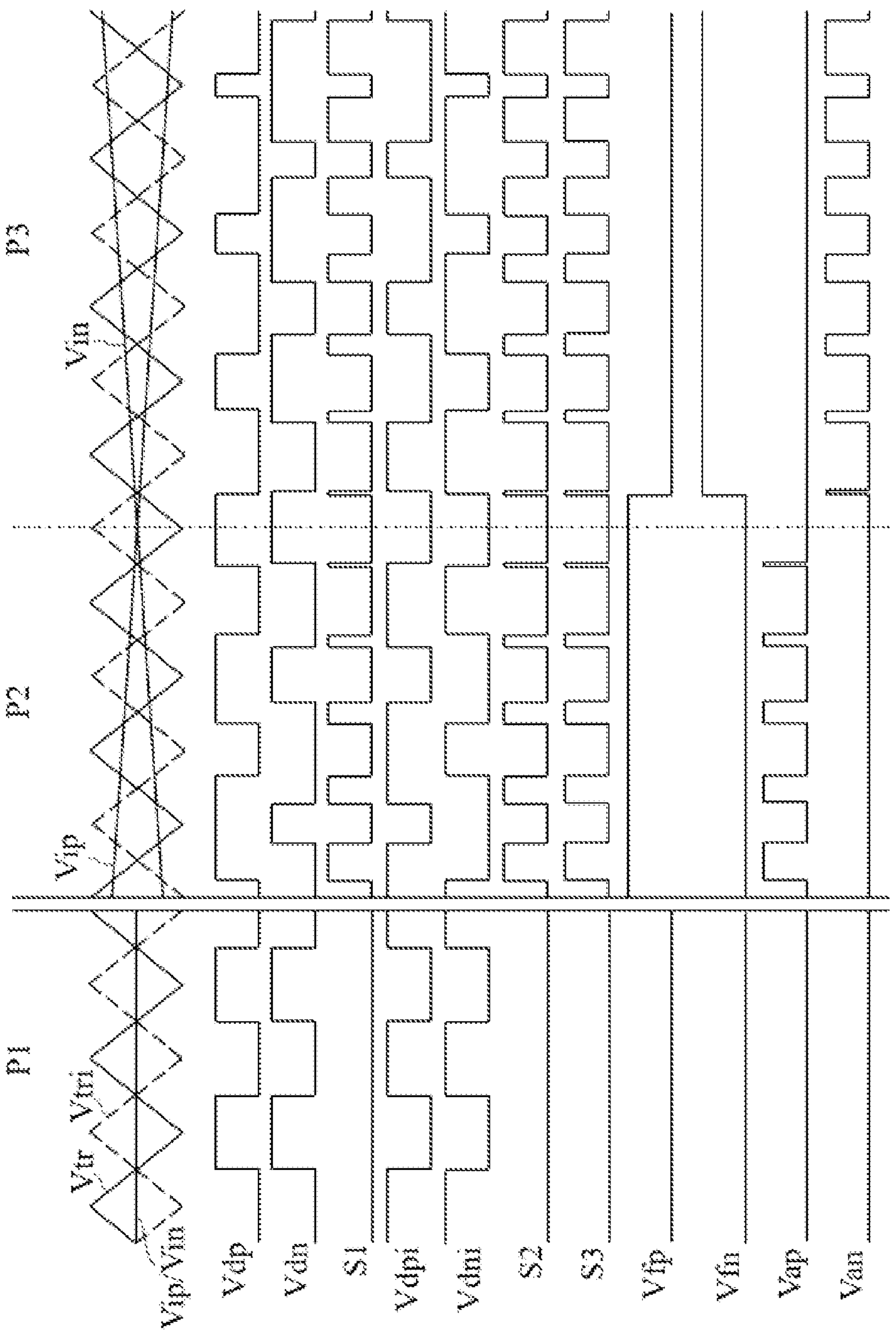
FIG. 6 is a timing diagram of some signals in the Class D amplifier of FIG. 5.

FIG. 5 is a schematic diagram of a third embodiment of a Class D amplifier of the present disclosure. A Class D amplifier 500 differs from the Class D amplifier 300 in that the Class D amplifier 500 also contains a third comparator 504, a fourth comparator 506, an exclusive OR gate 508, and a synthesis circuit 509. Here, a positive input end (+) of the third comparator 504 receives the positive end input signal Vip, and a negative input end (−) of the third comparator 504 receives an inverted triangular wave Vtri, where the inverted triangular wave Vtri is an inverted signal of the triangular wave Vtr. The third comparator 504 generates a third comparison result Vdpi based on the positive end input signal Vip and the inverted triangular wave Vtri. FIG. 6 is a timing diagram of some signals in the Class D amplifier 500. As shown in FIG. 6, when the positive end input signal Vip is greater than the inverted triangular wave Vtri, the third comparison result Vdpi is a high logic level; when the positive end input signal Vip is not greater than the inverted triangular wave Vtri, the third comparison result Vdpi is a low logic level. A positive input end (+) of the fourth comparator 506 receives the negative end input signal Vin, and a negative input end (−) of the fourth comparator 506 receives the inverted triangular wave Vtri. The fourth comparator 506 generates a fourth comparison result Vdni based on the negative end input signal Vin and the inverted triangular wave Vtri. Specifically, the inverted triangular wave Vtri is a periodic triangular wave signal, when the negative end input signal Vin is greater than the inverted triangular wave Vtri, the fourth comparison result Vdni is a high logic level; when the negative end input signal Vin is not greater than the inverted triangular wave Vtri, the fourth comparison result Vdni is a low logic level.

As shown in FIG. 6, in an ideal case, the first comparison result Vdp and the fourth comparison result Vdni are inversely related to each other; and the second comparison result Vdn and the third comparison result Vdpi are inversely related to each other. Therefore, a second control signal S2 generated by the exclusive OR gate 508 based on the third comparison result Vdpi and the fourth comparison result Vdni may be the same as the first control signal S1. However, in an undesired situation (e.g., common mode voltage offset), the second control signal S2 and the first control signal S1 may be slightly different from each other. Therefore, the synthesis circuit 509 may be used to generate a third control signal S3 by performing logic processing on the second control signal S2 and the first control signal S1, in order to eliminate errors caused by non-ideal factors. Then, the third control signal S3 is used in place of the first control signal S1 to feed the clock input end ck of the first flip-flop 310 and the clock input end ck of the second flip-flop 312. By way of example, in some embodiments, the synthesis circuit 509 contains a third AND gate (not depicted in the drawings), a first input end of the third AND gate and a second input end of the third AND gate receive the first control signal S1 and the second control signal S2 correspondingly, and an output end of the third AND gate outputs the third control signal S3.

The timing relationship in FIG. 6 is depicted based on an ideal state, in reality, a signal passes through each component in FIG. 5 with time consuming. Therefore, in some embodiments, a delay unit (not depicted in the drawings) is additionally provided to delay the third control signal S3 to generate the delayed third control signal. The delayed third control signal enters the second input end of the first AND gate 118 and the second input end of the second AND gate 120. Compared to the third control signal S3, the delayed third control signal is delayed by the same length of time as elapsed time for a signal to travel from the clock input ends ck to the output ends Q of the first flip-flop 310 and the second flip-flop 312, so that the first trigger result Vfp and the second trigger result Vfn are close to an ideal state as shown in FIG. 6. The present disclosure also proposes a chip, containing circuits 100/300/500. The present disclosure also proposes an electronic apparatus containing the chip. Specifically, the electronic apparatus includes, but is not limited to, mobile communication devices, ultra-mobile personal computer devices, portable entertainment devices and other electronic devices having data interaction capabilities. Mobile communication devices are characterized by mobile communication functions and have the primary objective of providing voice and data communication. Such terminals include: smartphones (e.g., iPhone), multimedia phones, feature phones, and low-end cell phones. Ultra-mobile personal computer devices belong to the category of personal computers and have computing and processing functions, and generally have mobile Internet access characteristics. Such terminals include: PDAs, MIDs, and UMPC devices, such as iPads. Portable entertainment devices may display and play multimedia content. Such devices include: audio and video players (e.g., iPods), handheld game consoles, e-books, as well as smart toys and portable car navigation devices.

The foregoing description briefly sets forth the features of certain embodiments of the present disclosure, and enables those having ordinary knowledge in the art to more fully understand the various modalities of the present disclosure. Those having ordinary knowledge in the art of the present disclosure should understand that the present disclosure can be easily utilized as a basis for designing or modifying other processes and structures to achieve the same purposes and/or advantages as the embodiments described herein. Those having ordinary knowledge in the art to which the present disclosure belongs should understand that these equivalent embodiments are still within the spirit and scope of the present disclosure and may be subject to various changes, substitutions, and modifications without departing from the spirit and scope of the present disclosure.

What is claimed is:

1. A class D amplifier, used to generate a differential output signal based on a differential input signal, wherein the differential input signal comprises a positive end input signal, a negative end input signal, and the differential output signal comprises a positive end output signal, a negative end output signal, and the class D amplifier comprises:

a PWM modulator, comprising:

a first comparator, configured to generate a first comparison result based on the positive end input signal and a triangular wave;

a second comparator, configured to generate a second comparison result based on the negative end input signal and the triangular wave;

an exclusive OR gate, configured to generate a first control signal based on the first comparison result and the second comparison result;

a first AND gate, wherein a first input end of the first AND gate is configured to receive a first input based on the first comparison result of the first comparator, a second input end of the first AND gate is configured to receive a second input based on the first control signal, and the first And gate is configured to generate a positive end PWM output based on the first input and second input; and a second AND gate, wherein a first input end of the second AND gate is configured to receive a third input based on the second comparison result of the second comparator, a second input end of the second AND gate is configured to receive a fourth input based on the first control signal, and the second And gate is configured to generate a negative end PWM output based on the third input and fourth input; and an output stage, configured to generate the positive end output signal based on the positive end PWM output and the negative end output signal based on the negative end PWM output.

2. The class D amplifier according to claim 1, wherein the PWM modulator further comprises:

a first flip-flop, a clock input end of the first flip-flop is configured to receive the first control signal and a data input end of the first flip-flop is configured to receive the first comparison result; and a second flip-flop, a clock input end of the second flip-flop is configured to receive the first control signal and a data input end of the second flip-flop is configured to receive the second comparison result;

wherein the first input end and the second input end of the first AND gate are correspondingly coupled to an output end of the first flip-flop and the first control signal, and the first input end and the second input end of the second AND gate are correspondingly coupled to an output end of the second flip-flop and the first control signal.

3. The class D amplifier according to claim 1, wherein the PWM modulator further comprises:

a first delay unit, configured to delay the first control signal for a first preset length of time to generate the delayed first control signal;

wherein the second input end of the first AND gate is configured to receive the delayed first control signal, and the second input end of the second AND gate is configured to receive the delayed first control signal.

4. The class D amplifier according to claim 3, wherein the first preset length of time is equal to elapsed time for a signal to travel from the clock input ends to the output ends of the first flip-flop and the second flip-flop.

5. The class D amplifier according to claim 1, wherein the PWM modulator further comprises:

a second delay unit, configured to delay the first comparison result for a second preset length of time to generate the delayed first comparison result; and a third delay unit, configured to delay the second comparison result for a third preset length of time to generate the delayed second comparison result;

wherein the first input end of the first AND gate is configured to receive the delayed first comparison result, and the first input end of the second AND gate is configured to receive the delayed second comparison result.

6. The class D amplifier according to claim 5, wherein the second preset length of time and the third preset length of time are equal to elapsed time for a signal to pass through the exclusive OR gate.

7. The class D amplifier according to claim 1, wherein the class D amplifier further comprises:

a first low-pass filter, coupled between an output end of the first AND gate and the output stage; and a second low-pass filter, coupled between an output end of the second AND gate and the output stage.

8. The class D amplifier according to claim 1, wherein the PWM modulator further comprises:

a third comparator, configured to generate a third comparison result based on the positive end input signal and an inverted triangular wave, wherein the inverted triangular wave is an inverted signal of the triangular wave;

a fourth comparator, configured to generate a fourth comparison result based on the negative end input signal and the inverted triangular wave;

the exclusive OR gate, configured to generate a second control signal based on the third comparison result and the fourth comparison result;

a synthesis circuit, configured to generate a third control signal based on the first control signal and the second control signal;

a first flip-flop, a clock input end of the first flip-flop is configured to receive the third control signal and a data input end of the first flip-flop is configured to receive the first comparison result; and a second flip-flop, a clock input end of the second flip-flop is configured to receive the third control signal and a data input end of the second flip-flop is configured to receive the second comparison result;

wherein the first input end and the second input end of the first AND gate are correspondingly coupled to an output end of the first flip-flop and the third control signal, and the first input end and the second input end of the second AND gate are correspondingly coupled to an output end of the second flip-flop and the third control signal.

9. The class D amplifier according to claim 8, wherein a frequency of the first comparison result is equal to a frequency of a second comparison result, and during a positive input phase and a negative input phase, a frequency of the first control signal is twice a frequency of the third comparison result, and the frequency of the first control signal is twice a frequency of the fourth comparison result.

10. The class D amplifier according to claim 8, wherein the synthesis circuit comprises a third AND gate, a first input end of the third AND gate is configured to receive the first control signal and a second input end of the third AND gate is configured to receive the second control signal, and an output end of the third AND gate is configured to output the third control signal.

11. The class D amplifier according to claim 8, wherein the PWM modulator further comprises:

a first delay unit, configured to delay the third control signal for a first preset length of time to generate the delayed third control signal; and wherein the second input end of the first AND gate is configured to receive the delayed third control signal, and the second input end of the second AND gate is configured to receive the delayed third control signal.

12. The class D amplifier according to claim 11, wherein the first preset length of time is equal to elapsed time for a signal to travel from the clock input ends to the output ends of the first flip-flop and the second flip-flop.

13. The class D amplifier according to claim 1, wherein the first control signal is zero when the differential input signal is zero.

14. The class D amplifier according to claim 1, wherein the positive end PWM output is zero when the positive end input signal is not higher than the negative end input signal.

15. The class D amplifier according to claim 1, wherein the negative end PWM output is zero when the negative end input signal is not higher than the positive end input signal.

16. The class D amplifier according to claim 1, further comprising:

a gate driver, coupled between the PWM modulator and the output stage.

17. The class D amplifier according to claim 1, wherein during a static phase, an amplitude of the positive end input signal and an amplitude of the negative end input signal are zero; during a positive input phase, an absolute value of the amplitude of the positive end input signal is equal to an absolute value of the amplitude of the negative end input signal, and the amplitude of the positive end input signal is greater than zero and the amplitude of the negative end input signal is less than zero; and during a negative input phase, the absolute value of the amplitude of the positive end input signal is equal to the absolute value of the amplitude of the negative end input signal, and the amplitude of the positive end input signal is less than zero and the amplitude of the negative end input signal is greater than zero.

18. The class D amplifier according to claim 1, wherein a frequency of the first comparison result is equal to a frequency of a second comparison result, and during a positive input phase and a negative input phase, the frequency of the first control signal is twice the frequency of the first comparison result, and the frequency of the first control signal is twice the frequency of the second comparison result.

19. A chip, comprising:

the class D amplifier according to claim 1.

20. An electronic apparatus, comprising:

the chip according to claim 19.

* * * * *